United States Patent [19]
Ballard et al.

[11] Patent Number: 5,617,480
[45] Date of Patent: Apr. 1, 1997

[54] DSP-BASED VEHICLE EQUALIZATION DESIGN SYSTEM

[75] Inventors: Bradley A. Ballard, Belleville; John W. Whikehart, Novi; Henry F. Blind, Grosse Pointe Woods; Robert E. Pierfelice, Allen Park, all of Mich.

[73] Assignee: Ford Motor Company, Dearborn, Mich.

[21] Appl. No.: 369,861

[22] Filed: Jan. 6, 1995

Related U.S. Application Data

[63] Continuation of Ser. No. 22,580, Feb. 25, 1993, abandoned.
[51] Int. Cl.⁶ .................................................. H03G 5/00
[52] U.S. Cl. .................................................. 381/98; 381/86
[58] Field of Search .............................. 381/103, 98, 56, 381/101, 102, 86

[56] References Cited

U.S. PATENT DOCUMENTS

| | | | |
|---|---|---|---|
| 4,186,274 | 1/1980 | Mayshar | 381/103 |
| 4,739,513 | 4/1988 | Kunugi et al. | 381/103 |
| 4,888,809 | 12/1989 | Knibbeler | 381/103 |
| 4,939,782 | 7/1990 | Gambacurta, Jr. et al. | 381/103 |
| 5,146,507 | 9/1992 | Satoh et al. | 381/103 |
| 5,212,733 | 5/1993 | Devitt et al. | 381/119 |
| 5,228,093 | 7/1993 | Agnello | 381/98 |

OTHER PUBLICATIONS

Dynawore Corp., "Ballade", advertisement on p. 19 of Electronic Musician, Dec. 1988.

"Eclipse EQS–2000, EQR–2140 & EQU–8040 DSP System", Car Stereo Review, Nov./Dec. 1992, pp. 77–79.

*Primary Examiner*—Forester W. Isen
*Attorney, Agent, or Firm*—Mark L. Mollon; Roger L. May

[57] ABSTRACT

A DSP-based vehicle equalization design system has been described, which allows the audio engineer to quickly and efficiently design an equalizer from an easy-to-use Graphic User Interface (GUI) computer interface. Vehicle equalizations, with high precision and parameter variability can be developed in a short period of time. The system and method of design provide DSP filter coefficients for use as-is in actual DSP-based production vehicle equalization hardware.

9 Claims, 5 Drawing Sheets

FIG 6
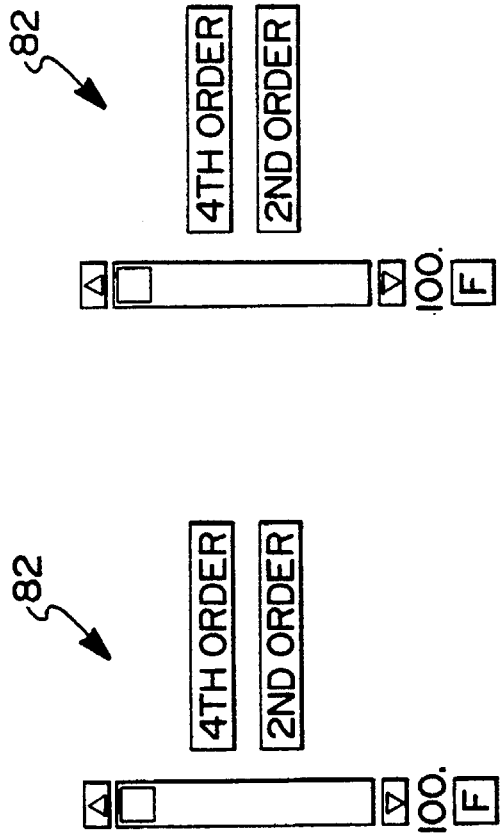
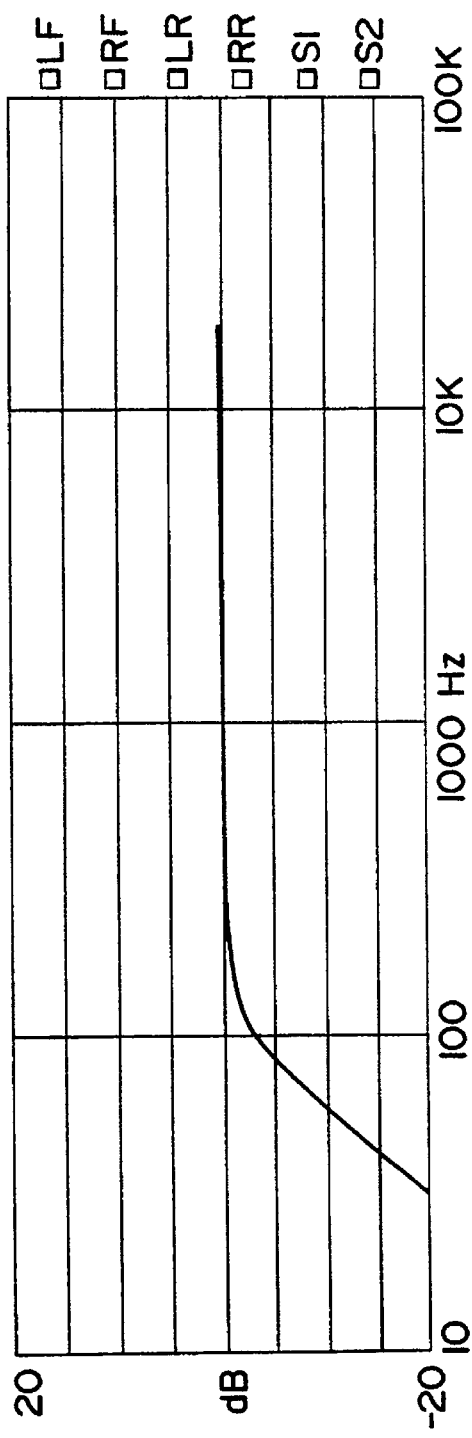

DSP-BASED VEHICLE EQUALIZATION DESIGN SYSTEM

This is a continuation of application Ser. No. 08/022,580 filed on Feb. 25, 1993, now abandoned

FIELD OF THE INVENTION

The present invention relates generally to audio reproduction systems and more particularly to apparatus and methods for designing equalization parameters for a DSP motor vehicle audio system.

BACKGROUND ART

The acoustical frequency response of an automobile audio system, measured at the listener position, is usually far from ideal. For example, a door mounted speaker which must be positioned behind a map pocket can affect the audio reproduction. It is therefore desirable to compensate for this response by imposing a correction signal upon the transducer to compensate for the acoustic aberrations due to the physical features of the interior of the vehicle and the speaker positions.

Equalization has been implemented electronically with common analog filter circuits, but these are susceptible to performance variations due to temperature and part tolerances. Due to limits in analog circuit capabilities, the previously known equalization circuits constructed according to a calculated design may only yield an approximate response correction. The design and construction of an analog equalization circuit can be time consuming, requiring several design, build and test iterations to achieve the desired response.

Another known apparatus for changing audio reproduction characteristics is disclosed in U.S. Pat. No. 5,146,507. An audio reproduction characteristics control uses parameter memory means for correcting frequency response by prestoring correction parameters, reflection characteristic parameters and sound-field characteristic parameters. However, there is no indication or suggestion as to how the parameters may be calculated or how they could be adjusted to accommodate differing environments such as automobiles having different interior dimensions and passenger accommodations. While the parameters may only be generally related to the acoustic conditions such as vehicle type, the prestored parameters can have a substantially different effectiveness in particularly different environments or vehicles. While the parameter selection means permits various prestored parameters to be employed, the parameters are unrelated to the particular environment in which the audio reproduction system may be installed.

A further known improvement in modifying frequency characteristics of an audio reproduction is incorporated in the eclipse ESQ-2000 by compensating for the acoustics of a particular vehicle interior. The apparatus permits access to a parametric equalization mode. A pink noise signal generated in the audio unit is delivered to the front and rear speaker channels. The acoustic reproduction is analyzed after being received in a sensor such as the microphone built into the front panel of the unit. The processor automatically compensates for response anomalies by providing a flat response to the generation of the pink noise. This is achieved through the use of parametric equalization filters. Each filter's center frequency can be set to one of twenty-six preset values between 63–20,000 Hz. While such a system provides additional control over the previously known units, the fixed microphone location does not provide the type of compensation parameters that would necessarily provide the most desirable sound at the location of an occupants ears within the vehicle passenger compartment. Moreover, although the unit includes a jack that accepts an external microphone, a single microphone still limits the directionality if not the listening position at which the parameters for adjusting the signal characteristics are determined. Furthermore, the only equalization response permitted is a flat response, and only over certain frequency bands, and such response may be undesirable in particular motor vehicle designs. Moreover, since the audio unit itself generates the pink noise signal, inaccuracies within the receiver section of the entertainment device will not be compensated for by the equalizing mechanism. In addition, such dash mounted apparatus provide very little visual assistance to the operator of the system except to identify the particular operational mode in which the audio reproduction device operates. In addition, the large number of controls and button layout complicates manipulation of the acoustic mechanism and the user's interactions with the unit.

SUMMARY OF THE INVENTION

The present invention overcomes the abovementioned disadvantages by providing an apparatus and method for digital signal processing (DSP) frequency response modification, and is particularly well adapted for the purpose of parametric equalization design although additional signal characteristic modifications can be designed as well. A DSP unit in a motor vehicle's audio path performs the equalization under the control of a computer, preferably, a personal computer (PC). The PC includes a Graphical User Interface (GUI) used by an automotive audio engineer to set the equalizer response of the DSP unit for a particular vehicle model. Once the response is achieved as detected by a frequency analyzer, the resulting equalization parameters are saved and can be programmed into an electronically programmable memory of a DSP unit in any automotive audio DSP system. This system produces more accurate and precisely repeatable equalizer performance, and greatly reduces equalizer design time for creating and limiting the equalization adjustment capacity of an equalizer maintained in DSP radio.

Preferably, the DSP unit executes parametric IIR (Infinite Impulse Response) equalization code. Although Finite Impulse Response (FIR) filters could also be used to obtain greater accuracy, they are less efficient and therefore less practical in a motor vehicle audio system. The corresponding DSP coefficients, which determine the filter response, are calculated as a result of user input to the PC and downloaded from the PC to the DSP unit.

The PC software preferably provides the Graphical User Interface (GUI) to control the entire design system. In the preferred embodiment, a plurality of first icons represent a plurality of frequency response characteristics. A plurality of second icons in the form of scroll tabs representing a range of design parameters are visually represented to the user as interface elements. Parameter adjustment is preferably achieved via a combination of a mouse clicks and drags, although other manual controls such as keyboard input can also be employed. The affected filter coefficients are then immediately calculated in the computer and downloaded, via a serial interface, to the digital filters implemented in the DSP unit. In addition, the frequency response of the resulting filters is calculated and plotted on the PC screen. The acoustic reproduction obtained is represented on the visual display of the analyzer.

A vehicle equalization method according to the present invention comprises the application of a pink noise test signal to the audio path of the vehicle's audio system prior to the DSP unit. The DSP unit outputs drive the system amplifiers and speakers. A microphone unit is located at the desired listening position (typically the driver's head location) to pick up the system's output signal. This signal is then sent to an audio analyzer for time-averaged analysis and visual display. Thus, the audio engineer can make changes to the DSP filter parameters by controlling the visual representation and corresponding signal processing functions until a desired equalizer response is obtained, for example, as visually represented on the audio analyzer display in real time. Typically, the vehicle is equalized in response to the front, rear, and subwoofer channels separately, and preferably separately for each of the left and right channels, and then the full system response is adjusted.

Thus the present invention provides the advantage of a simpler and faster design for filter parameters in the DSP-based audio reproduction system. A further advantage of the present invention is to provide a graphical user interface which substantially simplifies a designers interaction and calculation of appropriate filter parameters that inherently provide equalization adjustment capacity, and which is not limited to automatic equalization that delivers only a flat response as the optimum acoustical production. Moreover, it is an advantage of the present invention to provide fewer complications and more flexible adjustments to the filters including gain, center frequency and Q so as to provide flexibility in the design and ease of implementation of desirable acoustic reproduction signals.

It is also an advantage of the present invention to provide easily perceived visual representation of the changes being made to the filters as well as to the acoustical output resulting from the filter changes. It also an advantage of the present invention to provide numerous adaptations to the delays, crossovers and frequency range output throughout the range of acoustical reproduction in the most cost effective manner for mass production in motor vehicles whose listening environments differ substantially between motor vehicle models.

BRIEF DESCRIPTION OF THE DRAWING

The present invention will be more clearly understood by reference to the following detailed description when read in conjunction with accompanying drawing in which like reference characters refer to like parts throughout the views and in which:

FIG. 6 is a front view of a representation of a graphic user interface crossover screen employed in the system of FIG. 1;

DETAILED DESCRIPTION OF THE PREFERRED EMBODIMENT

Figure 1:
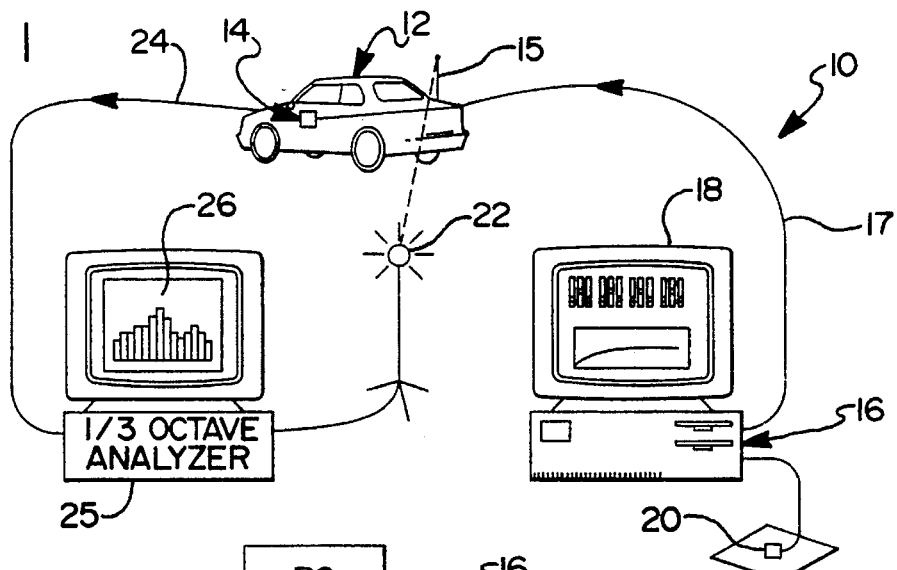
FIG. 1 is a diagrammatic view of the system according to the present invention.

Referring first to FIG. 1, an equalization design system 10 according to the present invention is thereshown comprising a listening environment 12, for example, the motor vehicle, carrying an audio reproduction system 14. The audio system is DSP based, as will be described in greater detail hereinafter. In addition, the system 10 includes a computer, for example, the personal computer (PC) 16 for controlling parameters introduced into the DSP based audio reproducer 14 and including a display monitor 18 as well as manual control, for example, the mouse 20. In addition, an audio frequency response analyzer, for example, a ⅓ octave analyzer such as Brüel and Kjær 2131 includes a receiver as indicated diagrammatically at 24. A generator of pink noise, or its equivalent as developed with the Brüel and Kjær 2131, is transmitted to at least a portion of the audio path formed by a signal source, the DSP unit, an amplifier and a set of speakers of the reproducer 14. For example, the pink noise signal may be sent by a broadcaster 22 for reception at an antenna of a tuner so that the equalization can compensate for tuner irregularities. Alternatively, other sources, for example a pink noise generator in a media playback device, e.g., a compact disc player, or playback of a prerecorded pink noise media, e.g., a compact disc, etc., may be employed for equalization design.

A preferred receiver includes a transducer preferably comprising a six microphone array as discussed at the AES Convention, New York, N.Y. in 1984, and at the SAE Convention in Detroit, Mich. in 1985 *Localized Sound Power Measurements* by E. Geddes and H. Blind. Regardless of the type receiver employed, the analyzer generates a visual representation 26 of the acoustical reproduction being recorded.

As used herein, the term equalization refers to reaching a desired acoustical response throughout one or more frequency ranges, including but not limited to a flat response throughout the range of frequencies acoustically reproduced. Moreover as used herein, the term icons refers to the symbols and the corresponding files, functions or programs represented by an activated icon as described in greater detail in the written description.

Figure 2:
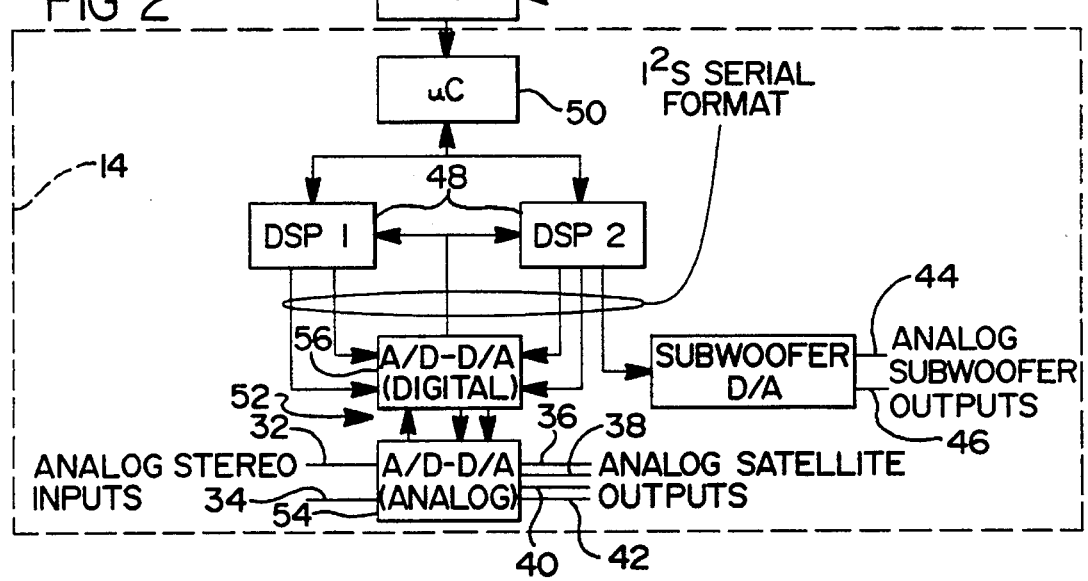
FIG. 2 is a schematic diagram of hardware used in system of FIG. 1.

A block diagram of the DSP unit which implements the crossover and equalization filters is shown in FIG. 2. In the preferred embodiment, two stereo input channels 32 and 34 are processed to provide four satellite output channels 36, 38, 40 and 42, as well as two subwoofer output channels 44 and 46. The core of the selected unit is comprised of two general purpose programmable DSP processors 48. For example, the Motorola 56001 DSP processors used in development, provide excess processing capability and assure design flexibility, and perform all of the required filtering for equalization, as well as other functions such as crossovers and delays as discussed in greater detail below. The DSP's are controlled by a microcontroller such as Motorola 68HC11 microcontroller 50. The microcontroller accepts data from the PC 16 through it's SPI serial port via an SAE J1708 physical layer. It then downloads this data to each DSP processor, utilizing an 8-bit parallel port dedicated for this purpose.

In the preferred embodiment, two channels of analog-to-digital (A/D) conversion and four channels of digital-to-analog (D/A) conversion are implemented for input and output, respectively, for example, by a Philips PCF5022/PCF5023 chip set 52. Both the A/D and D/A conversions are contained in the analog chip 54, and are oversampled to allow antialiasing and reconstruction filtering to be done using digital filters. These digital filters are contained in the digital chip 56. The digital chip 56 also performs the necessary sample rate conversions between the oversampled converters and the system sample rate of 44.1 kHz. In addition, a stereo D/A such as a Philips TDA 1541 is used for the two subwoofer outputs. The interfaces between the DSP processors and the converters are accordingly all in the Philips I$^2$S serial format.

Figure 3:
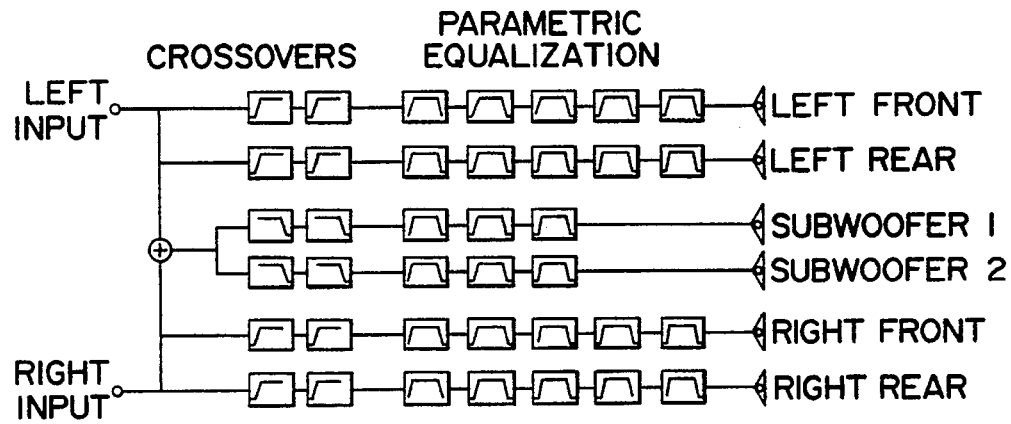
FIG. 3 is a diagrammatic representation of software functions accomplished with the hardware of FIG. 2.

A block diagram of the DSP software including the crossover filters and equalization filters is shown in FIG. 3. The left and right inputs are each applied to the highpass filter portions of the crossovers, and the outputs of these filters drive the equalization filters for the four (left-front, right-front, left-rear, and right-rear) satellite channels. The sum of the left and right inputs is applied to the lowpass filter portions of the crossovers and the outputs of these filters drive the two subwoofer equalization filters (subwoofer 1 and subwoofer 2).

Each of the six equalization channels consist of a cascade of second-order IIR bandpass filter sections. Each section is Direct Form 2, which normally is a poor structure for audiophile applications according to conventional teachings such as J. Dattorro, *The Implementation of Recursive Digital Filters for High-Fidelity Audio*, J. AUDIO ENG. SOC., Vol. 36, No. 11, Nov. 1988, but the 56001 allows this type of filter to be executed without truncation between sections. This, in effect makes the filter look like it is Direct Form 1, except for the first pole section and the last zero section.

In each IIR equalization section, the center frequency F, Q, and bandpass gain G may be set by the designer. The crossover sections, on the other hand, only allow the cut-off frequency and order of the filter to be changed. All output channels can have independent values for these parameters. To make sure filter coefficients have reasonable values, the maximum allowable Q is 10, and the maximum allowable gain is ±20 dB. In addition, input attenuation multipliers are included at the input of each channel to make sure no signal overload occurs within the filters. A gain multiplier at each channel output can be used to restore the signal level.

The PC software is organized into two sections: the graphical user interface section and the filter design section. The user interface features are best shown in FIGS. 4–8, displaying the screens having icons, preferably in the form of scroll tabs for setting the center frequency F, Q, and gain G, of each IIR section.

Figure 4:
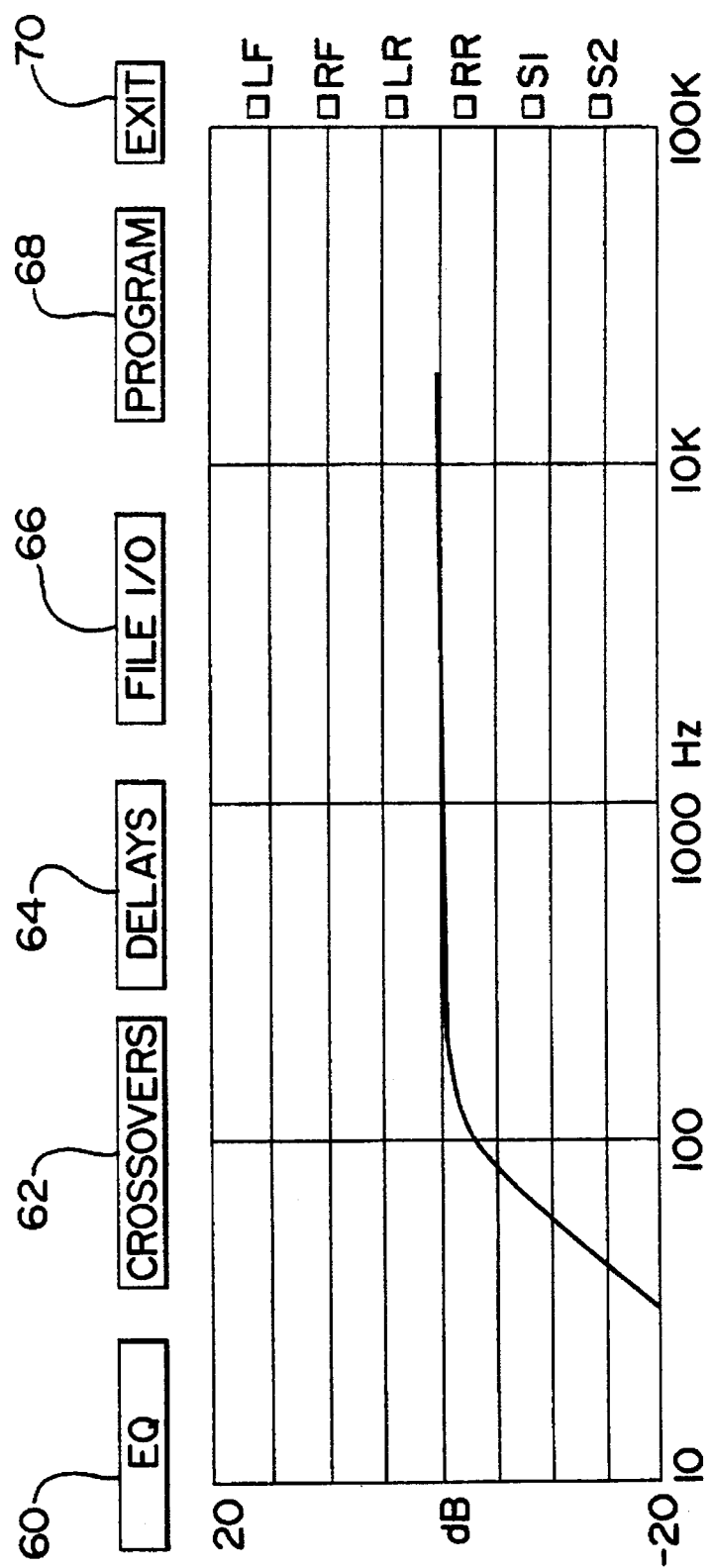
FIG. 4 is a front view of a representation of a graphic user interface menu screen employed in the system of FIG. 1.

FIG. 4 shows the main menu of the Graphical User Interface (or GUI). It presents the user with six icons each of which represent one of the major functions of the design tool. Moving the mouse for cursor alignment on any icon, and clicking on any of these icons with the left mouse button, brings up a GUI screen to adjust the sound field parameters associated with that major function. In general, EQ icon 60 allows the user to adjust the equalization filter parameters used for the modification of the vehicle's frequency response. Crossovers icon 62 allows the user to adjust the crossover filter parameters used for the system's subwoofer and satellite channels. Delay icon 64 permits early reflection and reverberation parameters to be adjusted. File I/O icon 66 allows the user to save and retrieve a set of parameters to and from disk. Program icon 68 allows the user to program an EPROM device in the target hardware with the current set of parameters. Exit icon 70 allows the user to exit the program. Preferably, exit icon 70 requires two clicks to exit in order to avoid inadvertent release.

Figure 5:
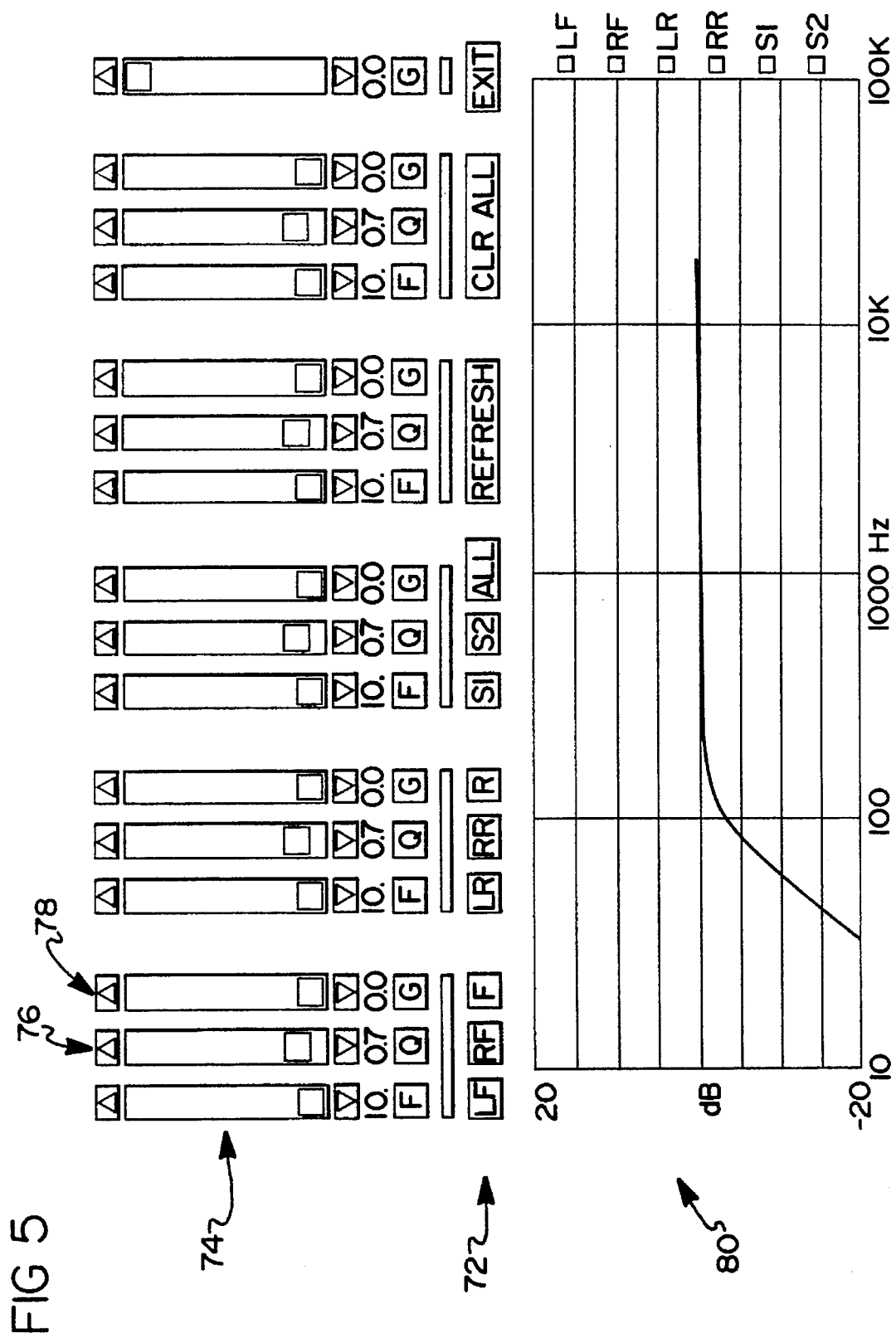
FIG. 5 is a front view of a representation of a graphic user interface equalization screen employed in the system of FIG. 1.
Figure 7:
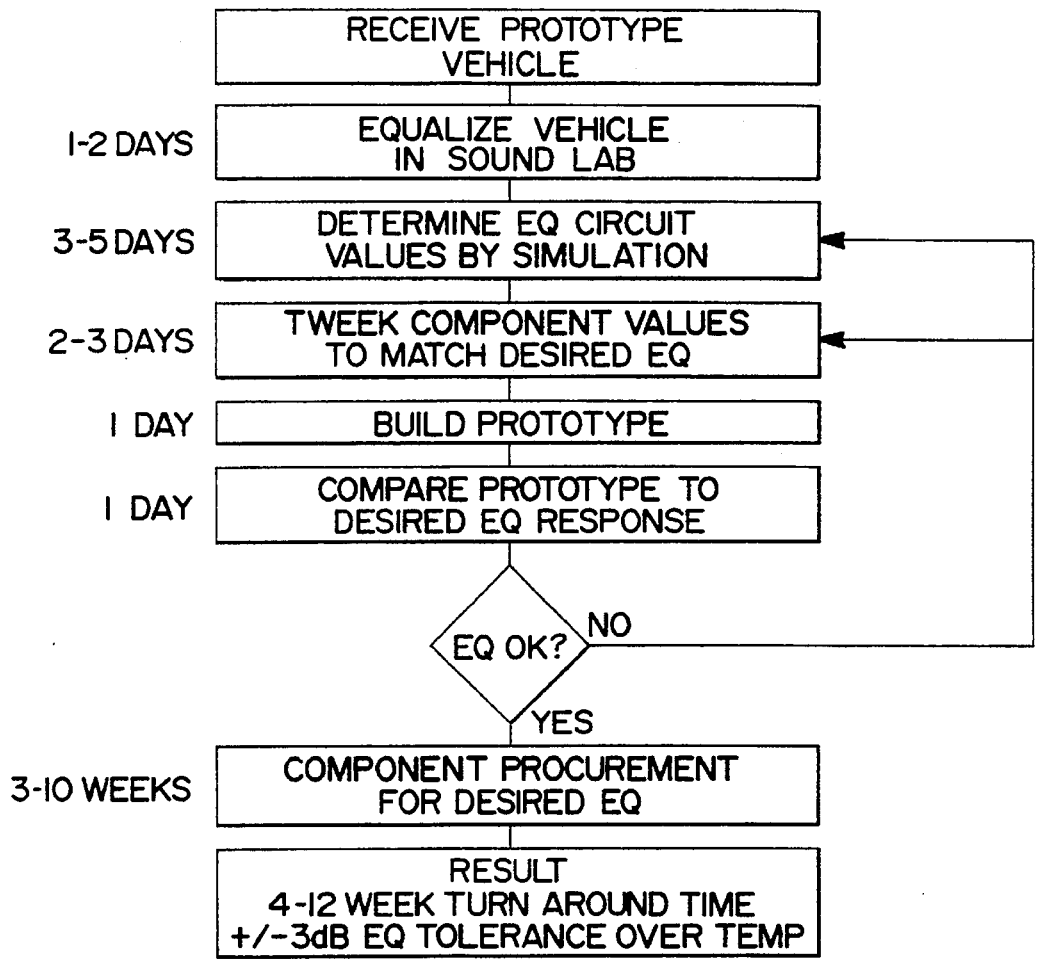
FIG. 7 is a diagrammatic flow chart of a prior art design method.
Figure 8:
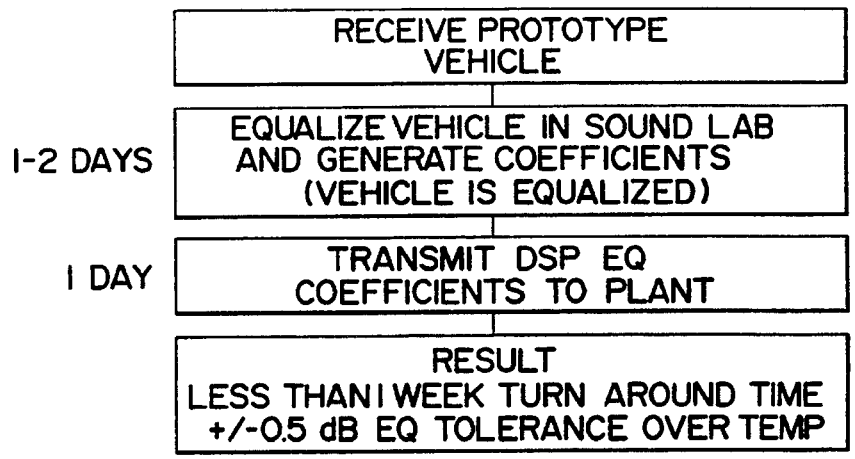
FIG. 8 is a diagrammatic flow chart of the design method of the present invention for comparison with FIG. 7.

FIG. 5 shows an EQ GUI screen. A row of status icons 72 appears in the center of the screen. Those labeled LF, RF, LR, RR, S1 and S2 are used to select an audio channel for frequency response modification. One channel of equalization is operative at a time, although the combined front channels, or the combined rear channels, or all the channels, can be operative collectively. Currently, the PC software supports 5 second order sections per channel. An audio channel is selected by clicking on one of these first 72 icons with the left mouse button. An icon will appear shaded to indicate that it is active. A series of second icons in the form of scroll tabs 74, 76 and 78 above the status icons will then display diagrammatic and numeric characters of the current filter parameter values for the selected channel. These parameters are center frequency F, Q, and gain G. Each grouping of F, Q, and G represents one second order filter section. Thus, in this example, there are five second order filter sections per audio channel. A single scroll tab is shown at the far right of the screen to represent the overall gain of the channel.

In the preferred embodiment, parameter adjustment is achieved by left mouse button clicks. A coarse adjustment of the parameters is made by clicking on the tab and dragging it to a new location and thus a new value. Alternatively, a mouse click at the desired tab destination will move the tab to it's new value. Fine control of the parameters is achieved by clicking on the up and down arrows associated with each scroll tab. Finally, a prompt for a numeric entry from the keyboard can be initiated by clicking the left mouse button on the scroll tab label F, Q, or G located directly below the scroll tab icon. A filter section can be cleared (returned to an allpass state) by clicking on the thin horizontal bar icon below the scroll tabs for that section. The CLEAR ALL icon clears all of the second order sections on all channels. Two left mouse button clicks are required for activation of this icon to prevent accidental clearing.

Following each parameter adjustment, the resulting filter coefficients are calculated by the computer and sent to the target audio device 14 across the digital communication link 17. In addition, the resulting electrical frequency response of the audio channel is calculated and plotted on the screen 80 below the scroll tab icons and status icons. This information is useful in preventing signal overload or signal-to-noise degradation within the filter cascade. The designer may need to re-order the filter sections to prevent such distortions. A REFRESH icon is provided to repeat all calculations and data transmissions and to re-plot the screen. In addition, an ALL icon is provided to superimpose the responses of all the audio channels onto the plot of the active channel. This icon also enables all audio channels to adjust the full system response and is toggled on and off with a left mouse button click.

The resolution of the frequency and gain scroll tabs is adjusted by clicking on the scroll tab icon with the right mouse button. This will toggle the frequency resolution through the following three settings:

1. 10–100 Hz in 1 Hz steps, 2. 10–1000 Hz in 10 Hz steps, and 3. 10–20,000 Hz in 200 Hz steps.

In a similar manner, the gain resolution is toggled through the following two settings:

1. 0–+20 dB in 0.2 dB steps, and

2. −20–0 dB in 0.2 dB steps.

The resolution on the Q scroll tabs is fixed at 0.1–9.9 in steps of 0.1.

The EXIT icon in all of the GUI screens returns the program to the main menu screen.

The time from scroll tab change to actual response change is almost immediate. Thus, by observing the net acoustical response of the system using the audio analyzer 26, and just a few mouse clicks, the designer can adjust the vehicle equalization in real time to achieve a desired response such as a flat response.

The novel interfacing capability described above is combined with a well-developed field of analog filter design with mature design methods. One of the techniques used to design digital IIR filters takes advantage of these methods by initially designing an analog filter prototype and then converting that prototype to a digital filter. This procedure is used in the preferred embodiment. Thus, the input parameters the program receives are identified with respect to the analog domain. The general transfer function for a continuous-time, second-order notch filter is given below, where the notch is infinite when the gain, $K_d=0$:

$$H(s) = \frac{s^2 + K_d\beta s + \Omega_0^2}{s^2 + \beta s + \Omega_0^2}, \beta = \frac{\Omega_0}{Q} \quad (1)$$

and where $\beta$ is the bandwidth of the filter and $\Omega_o$ is it's center frequency. The time-sampled system transfer function H(z), is derived from this equation by making use of the bilinear transformation (BLT) as taught for example in *Digital Signal Processing*, W. D. Stanley, Reston, Va.:Reston Publishing, 1975. The BLT is a conformal mapping of the s-plane into the z-plane. It uniquely maps the $j\Omega$-axis to the unit circle. In addition, the Left Half Plane (LHP) of the s-plane is mapped to the interior of the unit circle, while the Right Half Plane (RHP) is mapped to the exterior of the unit circle as shown for example in *Digital Signal Processing*, J. G. Proakis, D. G. Manolakis, N.Y.:Macmillan Publishing, 1988. A substitution of the BLT expression, $$s = C\left(\frac{1-z^{-1}}{1+z^{-1}}\right), \quad (2)$$

into Eq(1) for H(s) yields the desired time-sampled system transfer function H(z).

$$H(z) = k\frac{1 + b_1 z^{-1} + b_2 z^{-2}}{1 + a_1 z^{-1} + a_2 z^{-2}}, \quad (3)$$

where $a_i$ and $b_i$ are in terms of $\beta$, $\Omega_o$, and the BLT constant C. A constant gain factor k, is factored from the numerator H(z). This factor is combined with the gain factors for the other sections of the channel and implemented as part of it's input attenuator.

Examination of the BLT in terms of the s-plane and z-plane frequency variables $\Omega$ and $\omega$ respectively, yields the following relationship:

$$\omega = C\tan^{-1}\frac{\Omega t_s}{2}, \quad (4)$$

where $t_s$ is the sample period, and C is the BLT constant chosen to map the center frequency in the analog filter to the correct frequency in the digital filter. This relationship is highly non-linear. As a result, the bandpass corner frequencies in the continuous frequency variable $\Omega$ must be adjusted, or pre-warped, prior to the transformation to preserve the desired filter bandwidth in the time-sampled frequency variable $\omega$. Re-arrangement of Eq(4) yields the following expression for prewarping the corner frequencies, $$\Omega' = C\tan\left(\frac{\omega_d t_s}{2}\right), \quad (5)$$

where $\omega_d$ is the desired corner frequency in the digital domain. One additional concern with the BLT and bandpass filters is that, for filters with high center frequencies, a low Q could cause the transformed upper corner frequency to be greater than the Nyquist frequency, and thus invalid. Therefore, as part of the pre-warping process, the program tests the transformed upper corner frequency for validity. If it is found to be invalid, the filter's Q is automatically increased, thus lowering the corner frequency. This test is done in an iterative fashion until the corner frequency is valid. Once the pre-warped filter parameters have been calculated, the $a_i$ and $b_i$ terms are calculated along with the constant k, and downloaded to the DSP's.

The calculations done by the PC program include manipulating the input parameters center frequency $f_c$ (F), Q, and gain G to generate the filter coefficients k, $a_1$, $a_2$, $b_1$, and $b_2$. The program first calculates the radian center frequency and bandwidth of the analog prototype from $f_c$ and Q.

$$\omega_0 = 2\pi f_c, \beta = \omega_0/Q. \quad (6)$$

With these values, the desired corner frequencies are calculated, $$\omega_l = \frac{-\beta + \sqrt{\beta^2 + 4\omega_0^2}}{2}, \omega_h = \omega_l + \beta. \quad (7)$$

Next, the BLT constant C, and the pre-warped corner frequencies $\omega_h$ and $\omega_l$ and bandwidth $\beta'$ are calculated.

$$C = \frac{\omega_0}{\tan\left(\frac{\omega_0 t_s}{2}\right)}, \Omega_l = C \cdot \tan\left(\frac{\omega_l t_s}{2}\right) \quad (8)$$

$$\Omega_h = C \cdot \tan\left(\frac{\omega_h t_s}{2}\right), \beta' = \Omega_h - \Omega_l.$$

The denominator terms for the coefficients $a_i$ and $b_i$, and the gain constant k, are then calculated. The equations for these coefficients have been conveniently tabulated by *Digital Signal Processing*, W. D. Stanley, Reston, Va.:Reston Publishing, 1975.

$$a = C^2 + \beta'C + \omega_0^2, b = C^2 + G\beta'C + \omega_0^2 k = b/a \quad (9)$$

And finally, $a_1$, $a_2$, $b_1$, and $b_2$ are calculated, $$a_1 = \frac{-2C^2 + 2\omega_0^2}{a}, a_2 = \frac{C^2 - \beta'C + \omega_0^2}{a} \quad (10)$$

$$b_1 = \frac{-2C^2 + 2\omega_0^2}{b}, b_2 = \frac{C^2 - G\beta'C + \omega_0^2}{b}$$

and downloaded to the DSP unit.

FIG. 6 shows the crossover screen. It has two frequency scroll tabs, one represents the subwoofer crossover filters and one represents the satellite crossover filters. Icons representing filter order are displayed next to the respective scroll tabs. The parameters which determine the 3 dB cutoff frequencies and order of the crossover filters are thus modified on this screen. The icons and scroll tabs are manually operated in the same manner as in the EQ screen icons, respectively. The appropriate coefficients for crossover filters are calculated and sent to the DSP unit, and the frequency responses of all the audio channels are calculated and plotted on the screen.

The file I/O screen has three icons for file manipulation. The WRITE icon, activated by a left button mouse click, prompts the user for a filename and then writes the current parameter values to a file on the disk. The DIR icon executes a DOS directory command and displays all the filenames with the EQ filename extension. The READ icon prompts the user for a filename, and then reads the parameter values stored in the file. The corresponding coefficients are then calculated and sent to the DSP unit. The filter responses are also calculated and plotted on the screen.

The Graphic User Interface of the present invention is also readily adapted for the design of other signal characteristic modifications, such as ambience reproduction by the addition of simulated early reflections and reverberation. For example, a set of first icons for selecting predetermined ambience reproductions may be provided with accompanying scroll tabs for setting labeled characteristics. The first icons may represent settings such as those conventionally referred to as HOME listening environment, CLUB listening environment, HALL listening environment, CHURCH listening environment and STADIUM listening environment. The selection of each of these ambience status icons would display a plurality of labeled scroll tabs representing the direct signal gain, overall early reflections gain, and reverberation gain of the ambience reproduction signal for each of one or more channels. In a similar manner, a second screen would have scroll tabs that control a tapped delay line filter for early reflections generation, and comb and all pass filters for reverberation. These scroll tabs would represent the delays and gains of the filters as well as any frequency response modification parameters which may be incorporated into the filters, such as a low pass filter. In either case, a graphical display of the impulse response of ambience reproduction filters could be displayed below the status icons.

The design time required to equalize a vehicle is greatly improved with this DSP-based design system. This is due primarily to the absence of any discrete circuit components in the design, as is evident by comparing FIGS. 7 and 8, demonstrating the analog and DSP based design processes, respectively. The equalization and parameter determination portions of the two processes may require about the same amount of time. But, in the case of the DSP-based system, once these parameters are determined the design is completed. In the analog-based design process as demonstrated in FIG. 7, the circuit must be simulated to determine component values, and a prototype board must be built. Typically, this process must be repeated due to component limitations, (e.g. standard values) and to remove the effects of component tolerance variations. As a result, a 4–12 week design time is generally required for the analog design process and an equalization tolerance of ±3 dB is achieved over conventional ambient temperature ranges. The DSP-based design system of the present invention, as demonstrated in FIG. 8, has a substantially shorter design time of a fraction of 1 week and an equalization tolerance of ±0.5 dB over conventional ambient temperature ranges.

Having thus described the present invention, modifications will become apparent to those skilled in the pertinent art without departing from the scope and spirit of the present invention as defined in the appended claims. For example, the process may be fully automated by incorporating the analysis part of the design into the PC. This could be accomplished through the use of an expert system to determine the deviation from a desired response and adapt the design towards the desired response. In addition, a process of automatically arranging the cascade sequence of second-order filter sections has been developed to minimize signal degradation. This process is an extension of a process developed by Snelgrove et al. *Optimization of Dynamic Range in Cascade Active Filters*, Proc. 1978 IEEE INT'S SYMPOSIUM ON CIRCUITS AND SYSTEMS and would remove the burden of arranging the sequence of filter sections from the designer, while the graphical user interface would still permit monitoring of the process.

We claim:

1. An equalization design system for determining the design parameters limiting the equalization adjustment capacity of a DSP-based audio reproduction system, said audio reproduction system having an equalizer with limited user adjustment, and installed in a particular model of a motor vehicle, the design system comprising:

a DSP audio reproduction system including at least one signal source, a DSP unit, an amplifier and a speaker set forming an audio path;

a source of pink noise transmitting to at least a portion of the audio path;

an audio analyzer detecting selected audio response characteristics responsive to said source of pink noise, including at least one microphone;

a computer for generating signal processing coefficients in response to an operator interactively adjusting signal processing parameters including each of the center frequency, the Q and the gain parameters of audio reproductions, said center frequency being adjustable in steps of not more than about 200 Hz in a range up to about 20,000 Hz, or steps of not more than about 10 Hz in a range up to about 1000 Hz, or steps of not more than about 1 Hz in a range up to about 100 Hz, and including a display monitor, said computer being programmed with a graphical user interface for coordinating adjustments in real time with visual icons displayed on said display monitor for each of said center frequency, Q and gain parameters to obtain a set of production filter coefficients to be propagated for each radio to be installed in a production unit of the particular model of motor vehicle and to obtain in real time the limits of adjustment capacity.

2. A graphical user interface for designing a production equalizer that provides a predetermined set of production signal processing coefficients to the DSP that inherently limit adjustment capacity for a particular production model of motor vehicle, said set to be introduced in a DSP-based audio reproduction system installed in the particular model of production motor vehicle, with a design system comprising a noise source and an audio analyzer, the interface comprising:

a computer having a display monitor, manual controls, and a graphical user interface program for generating a plurality of screens on said display monitor, at least one of said screens including a plurality of first icons each corresponding to an individual frequency characteristic parameter taken from the group consisting of center frequency, Q, and gain, said center frequency being adjustable in steps of not more than about 200 Hz in a range up to about 20,000 Hz, or steps of not more than about 10 Hz in a range up to about 1000 Hz, or steps of not more than about 1 Hz in a range up to about 100 Hz, to be designed by generating filter coefficients in the computer in response to an operator interactively adjusting a plurality of second icons, each second icon corresponding to a variably adjustable range of values determined by generating signal processing coefficients in response to an operator's interaction with said icons, to obtain a production set of signal processing coefficients for equalizer parameters to be installed in each production unit of said particular model of motor vehicle for said individual frequency characteristic parameter.

3. A method for designing equalization adjustment for acoustical reproduction response in a DSP audio system for a particular production model of motor vehicle, with a system having at least one signal source, a DSP unit, an amplifier and a plurality of speakers forming an audio path, comprising:

generating a pink noise signal to at least a portion of said audio path;

monitoring the audio reproduction signal responsive to said pink noise signal and visually representing the response on an audio analyzer display;

monitoring and variably generating signal processing coefficients in response to an operator interactively modifying signal processing parameters, for introduction within the DSP, with a programmed computer having a display monitor and an interactive manual control, the program providing a graphical user interface for interactively monitoring and designing signal processing coefficients for introducing signal processing functions to said DSP, and including visually representing selected variably modified parameters of said signal processing functions taken from the group consisting of frequency, Q and gain said frequency being adjustable in steps of not more than about 200 Hz in a range up to about 20,000 Hz, or steps of not more than about 10 Hz in a range up to about 1000 Hz, or steps of not more than about 1 Hz in a range up to about 100 Hz; and adjusting the visual representations and corresponding signal processing functions on said display monitor by manipulation of said interactive control, and generating a responsive visual representation of the responsive signal processing on the audio analyzer display to obtain a set of production filter coefficients to be propagated as the adjustment capacity for acoustical response for each DSP audio system to be installed in the particular production model of motor vehicle.

4. The method as defined in claim 3 wherein the monitoring audio reproduction signal step comprises arranging a plurality of microphones in a predetermined position in a motor vehicle.

5. The method as defined in claim 3 wherein said graphical user interface includes a plurality of display screens, at least one of said screens having a plurality of first icons corresponding to said frequency characteristic parameters, and a plurality of second icons, each second icon corresponding to a predetermined variably adjustable range of values for one frequency characteristic parameter, and further comprising the step of interactively adjusting a predetermined range represented by at least one of said second icons.

6. The method as defined in claim 3 and further comprising programming a plurality of said DSP, to be installed in the particular production model of motor vehicle, with a production set of filter coefficients generated in response to interactively selecting signal processing function parameters selected from at least one set of visual representations and corresponding signal processing functions generating said desired representation of the audio response.

7. The method as defined in claim 3 wherein said desired response is a flat response.

8. The invention as defined in claim 2 wherein said graphical interface includes a graphical representation of at least one of a frequency response of the filters and an acoustic reproduction response.

9. The invention as defined in claim 8 wherein said graphical interface includes a graphical representation selector for alternatively displaying a frequency response of the filters and an acoustic reproduction response.

* * * * *